United States Patent
Nakao et al.

(10) Patent No.: US 6,487,774 B1
(45) Date of Patent: Dec. 3, 2002

(54) METHOD OF FORMING AN ELECTRONIC COMPONENT USING INK

(75) Inventors: Keiichi Nakao, Hirakata (JP); Satoshi Tomioka, Moriguchi (JP); Hideyuki Okinaka, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/381,655

(22) PCT Filed: Jan. 22, 1999

(86) PCT No.: PCT/JP99/00238

§ 371 (c)(1),
(2), (4) Date: Dec. 21, 1999

(87) PCT Pub. No.: WO99/38176

PCT Pub. Date: Jul. 29, 1999

(30) Foreign Application Priority Data

Jan. 22, 1998 (JP) .............................. 10-010212

(51) Int. Cl.⁷ ........................... B23P 17/00; B05D 5/12; B05D 1/36
(52) U.S. Cl. ........................... 29/890.1; 29/830; 29/831; 29/852; 427/96; 427/97; 427/190; 427/201; 427/205; 252/62.51 R
(58) Field of Search .............................. 29/890.1, 602.1, 29/25.42, 830, 831, 848, 849, 852; 427/96, 97, 190, 191, 197, 201, 205; 361/306.3, 308.1, 321.2; 252/62.51 R; 118/300

(56) References Cited

U.S. PATENT DOCUMENTS

| | | | | |
|---|---|---|---|---|
| 3,812,442 A | * | 5/1974 | Muckelroy | ................. 29/602.1 |
| 3,845,365 A | * | 10/1974 | Hicks | ......................... 29/25.42 |
| 4,546,065 A | * | 10/1985 | Amendola et al. | ............. 29/848 |
| 4,586,972 A | * | 5/1986 | Yokotani et al. | ............ 29/25.42 |
| 4,775,503 A | * | 10/1988 | Dubuisson | .................... 29/830 |
| 5,001,598 A | * | 3/1991 | Constantine | ................ 29/25.42 |
| 5,101,319 A | | 3/1992 | Diffeyes et al. | |
| 5,287,620 A | * | 2/1994 | Suzuki et al. | .................. 29/852 |

FOREIGN PATENT DOCUMENTS

| | | | | |
|---|---|---|---|---|
| JP | 64-5095 | | 1/1989 | |
| JP | 64-53519 | * | 3/1989 | .............. 361/321.2 |
| JP | 3-108307 | | 5/1991 | |
| JP | 3-247702 | | 11/1991 | |
| JP | 3-272197 | * | 12/1991 | ................... 427/96 |
| JP | 4-76908 | | 3/1992 | |
| JP | 5-55075 | | 3/1993 | |
| JP | H5-25381 | | 4/1993 | |
| JP | 5-90069 | | 4/1993 | |
| JP | 5-205970 | | 8/1993 | |
| JP | 5-226179 | | 9/1993 | |
| JP | 5-242724 | | 9/1993 | |
| JP | 5-275263 | | 10/1993 | |
| JP | 5-299288 | | 11/1993 | |
| JP | 8-222475 | | 8/1996 | |

* cited by examiner

Primary Examiner—Peter Vo
Assistant Examiner—A. Dexter Tugbang
(74) Attorney, Agent, or Firm—McDermott, Will & Emery (57) ABSTRACT

A method of manufacturing an electronic component utilizing an ink jet method using an ink including water or organic solvent, and one of metal powder, ceramic powder, magnetic powder, glass powder, and resistor powder with particle size of 0.001 μm or more to 10 μm or less, dispersed in this water or organic solvent, by 1 wt. % or more to 80 wt. % or less, at viscosity of 2 poise or less.

25 Claims, 7 Drawing Sheets

METHOD OF FORMING AN ELECTRONIC COMPONENT USING INK

TECHNICAL FIELD

The present invention relates to an ink for electronic component used in various electronic appliances such as laminate ceramic capacitor, LC filter, and complex high frequency component, a manufacturing method of electronic component by using this ink for electronic component, and an ink jet device.

BACKGROUND ART

In a laminate ceramic electronic component which is a conventional example of electronic component, an electrode ink is printed and formed in a specified pattern as an internal electrode on. a ceramic green sheet composed of ceramic powder, polyvinyl butyral resin, and a slight portion of plasticizer, and a specified number of sheets are laminated, cut, and baked, and an external electrode is formed. As such electrode ink, various types have been proposed for screen printing, including, for example, an ink for internal electrode of laminate ceramic capacitor for screen ink prepared by kneading nickel metal powder by three rolls as disclosed in Japanese Laid-open Patent No. 5-205970, and an electrode ink for screen ink using ceramic powder coated with palladium proposed in Japanese Laid-open Patent No. 5-275263.

Further in Japanese Laid-open Patent No. 5-55075, a conductor paste containing nickel oxide is proposed for screen printing technology. In Japanese Laid-open Patent No. 5-90069, it is proposed to add rosin to a conductive paste for screen. Also in Japanese Laid-open Patent No. 5-226179, it is proposed to add scaly powder to a conductor paste for screen. In Japanese Laid-open Patent No. 5-242724, similarly, a conductive paste for screen by adding organic phosphoric acid is proposed. In Japanese Laid-open Patent No. 5-275263, coating zirconia powder with nickel or other base metal, a conductive paste for screen printing is proposed. In Japanese Laid-open Patent No. 5-299288, using polyether urethane resin, a manufacturing method of laminate ceramic capacitor for screen printing of internal electrode is proposed.

In the manufacturing method of laminate ceramic electronic component such as laminate ceramic capacitor, the internal electrode has been printed and formed by screen printing, but in order to lower the cost and enhance the performance, a gravure printing process is proposed in Japanese Patent Publication No. 5-25381 or Japanese Patent Publication No. 8-8200. In U.S. Pat. No. 5,101,319, a calender processing of electrode by gravure printing for laminate ceramic capacitor is proposed.

In the conventional electrode inks (whether for screen printing or for gravure, etc.), since an organic solvent is used as the main solvent, when printed on a ceramic green sheet, the ceramic green sheet may be swollen or dissolved again by the organic solvent contained in the electrode ink. Accordingly, as far as the thickness of the ceramic green sheet is 20 $\mu$m or more, it rarely causes shorting, but when the thickness of the ceramic green sheet is less than 15 $\mu$m, the shorting probability is very high.

To solve this problem, hitherto, a manufacturing method of ceramic electronic component by direct gravure printing on the green sheet has been proposed, for example, as disclosed in Japanese Patent Publication No. 8-8200. In this case, however, the shorting probability is high when the ceramic green sheet is thin, and accordingly Japanese Patent Publication No. 5-25381 proposes a method of transferring a gravure printed pattern on the ceramic green sheet because the ceramic green sheet may be swollen or damaged when the electrode is directly printed on the ceramic green sheet. Thus, regardless of the printing method, in the conventional electrode ink, the ceramic green sheet was damaged, and the shorting problem was caused in thin ceramic green sheets of 15 $\mu$m or less.

In the conventional ink jet device, it was designed to print by filling an ink cartridge of a commercial ink jet printer with an ink. When printed by this ink jet device, the ink often precipitated or gathered near the ink jet nozzle for injecting the ink, causing the problem of ink clogging.

The invention is to solve the problems of the prior arts, and it is hence an object thereof to present an ink for electronic component capable of preventing re-dissolving of ceramic green sheet and baking, a manufacturing method of electronic component by using this ink for electronic component, and an ink jet device.

SUMMARY OF THE INVENTION

To achieve the object, the invention comprises water or organic solvent, and one of metal powder, ceramic powder, magnetic powder, glass powder, or resistor powder with particle size of 0.001 $\mu$m or more to 10 $\mu$Am or less, dispersed in this water or organic solvent, by 1 wt. % or more to 80 wt. % or less, at viscosity of 2 poise or less.

Or it comprises water or organic solvent, and a resin dispersed in this water or organic solvent, by 1 wt. % or more to 80 wt. % or less, at viscosity of 2 poise or less.

The method comprises the steps of repeating a plurality of times of a process of forming a specified ink pattern on a ceramic green sheet by an ink jet method by using an ink prepared by dispersing metal powder with particle size of 0.001 $\mu$m or more to 10 $\mu$m or less, in at least water or organic solvent, by 1 wt. % or more to 80 wt. % or less, at viscosity of 2 poise or less, laminating a plurality of the ceramic green sheets forming this ink pattern to form a raw laminated body of ceramic, cutting to specified shape and baking, and forming an external electrode.

Or the method comprises the steps of repeating a plurality of times of a process of forming a specified first ink pattern on a ceramic green sheet by an ink jet method by using a first ink prepared by dispersing metal powder with particle size of 0.001 $\mu$m or more to 10 $\mu$m or less, in at least water or organic solvent, by 1 wt. % or more to 80 wt. % or less, at viscosity of 2 poise or less, and forming a specified second ink pattern by an ink jet method by using a second ink prepared by dispersing ceramic powder with particle size of 0.001 $\mu$m or more to 10 $\mu$m or less, in at least water or organic solvent, by 1 wt. % or more to 80 wt. % or less, at viscosity of 2 poise or less, laminating a plurality of the ceramic green sheets forming these ink patterns to form a raw laminated body of ceramic, cutting to specified shape and baking, and forming an external electrode.

Further, the method comprises the steps of repeating a plurality of times of a process of forming a specified ink pattern on a ceramic green sheet by a gravure printing method by using an ink prepared by dispersing metal powder with particle size of 0.001 $\mu$m or more to 10 $\mu$m or less, in at least water or organic solvent, by 1 wt. % or more to 80 wt. % or less, at viscosity of 2 poise or less, laminating a plurality of the ceramic green sheets forming this ink pattern to form a raw laminated body of ceramic, cutting to specified shape and baking, and forming an external electrode.

Or the method comprises the steps of repeating a plurality of times of a process of forming a specified first ink pattern on a ceramic green sheet by an ink jet method by using a first ink prepared by dispersing metal powder with particle size of 0.001 μm or more to 10 μm or less, in at least water or organic solvent, by 1 wt. % or more to 80 wt. % or less, at viscosity of 2 poise or less, forming a specified second ink pattern by an ink jet method by using a second ink prepared by dispersing ceramic powder with particle size of 0.001 μm or more to 10 μm or less, in at least water or organic solvent, by 1 wt. % or more to 80 wt. % or less, at viscosity of 2 poise or less on the upper surface of the ceramic green sheet so as to cover this first ink pattern, and forming a ceramic layer integrated with the ceramic green sheet, laminating a desired plurality of the ceramic green sheets having the ceramic layer to form a raw laminated body of ceramic, cutting to specified shape and baking, and forming an external electrode.

Also, the method comprises the steps of forming a pair of upper electrode layers on a confronting upper side of a substrate by an ink jet method, forming a resistance layer so as to straddle over the upper electrode layers by an ink jet method by using an ink prepared by dispersing resistance powder with particle size of 0.001 μm or more to 10 μm or less, in at least water or organic solvent, by 1 wt. % or more to 80 wt. % or less, at viscosity of 2 poise or less, and forming a glass projective layer at least to cover this resistance layer by an ink jet method by using an ink prepared by dispersing glass powder with particle size of 0.001 μm or more to 10 μm or less, in at least water or organic solvent, by 1 wt. % or more to 80 wt. % or less, at viscosity of 2 poise or less.

Also, the method comprises the steps of forming a pair of upper electrode layers on a confronting upper side of a substrate by an ink jet method, forming a resistance layer so as to straddle over the upper electrode layers by an ink jet method by using an ink prepared by dispersing resistance powder with particle size of 0.001 μm or more to 10 μm or less, in at least water or organic solvent, by 1 wt. % or more to 80 wt. % or less, at viscosity of 2 poise or less, and forming a glass projective layer at least to cover this resistance layer by an ink jet method by using an ink prepared by dispersing a resin, in at least water or organic solvent, by 1 wt. % or more to 80 wt. % or less, at viscosity of 2 poise or less.

Also, the method comprises the steps of injecting a magnetic ink prepared by dispersing magnetic powder with particle size of 0.001 μm or more to 10 μm or less, in at least water or organic solvent, by 1 wt. % or more to 80 wt. % or less, at viscosity of 2 poise or less, and an electrode ink alternately in a specified pattern by an ink jet method, forming a block body of a three-dimensional structure having the electrode ink printed inside in a coil form so as to cover the electrode ink with the magnetic ink, and cutting this block body into a specified form and baking.

Also, the method comprises the steps of forming a ceramic green sheet having an electrode pattern by repeating a plurality of times of a process of injecting an electrode ink by an ink jet method from the upper surface of a ceramic green sheet having a base film with a penetrating via hole and forming an electrode pattern on the upper surface of this ceramic green sheet and in the via hole, and a process of filling at least the via hole with the electrode pattern and peeling off the base film, laminating a desired number of the ceramic green sheets having the electrode pattern so as to connect between the upper and lower electrode patterns electrically to form a raw laminated body of ceramic, cutting into a specified shape and baking, and forming an external electrode.

The invention also presents an apparatus comprising an ink tank filled with an ink, a first tube for sucking the ink in this ink tank through a suction mechanism, an ink injection unit connected to this first tube for injecting a required amount of the ink, and a second tube connected to this ink injection unit for circulating the ink not injected from the ink injection unit into the ink tank.

Also, the apparatus comprises a dispersing machine filled with an ink, a first tube for sucking the ink in this dispersing machine through. a suction mechanism, an ink injection unit connected to this first tube for injecting a required amount of the ink, and a second tube connected to this ink injection unit for circulating the ink not injected from the ink injection unit into the dispersing machine.

BEST MODE OF CARRYING OUT THE INVENTION

Embodiment 1

An ink for electronic component in embodiment 1 of the invention is described below.

The ink for electronic component in embodiment 1 comprises water or organic solvent, and metal powder with particle size of 0.001 μm or more to 10 μm or less, dispersed in this water or organic solvent, by 1 wt. % or more to 80 wt. % or less, at viscosity of 2 poise or less.

First, to 100 g of Pd powder with particle size of about 3 μm, 150 g of organic solvent or water containing 1 g of additive or resin is added.

Herein, as the metal powder, silver, palladium, platinum, palladium, copper, or the like is added. As the additive, phthalate solvent such as butyl phthalate, or polyethylene oxide, or the like is added. As the resin, by adding cellulose resin, vinyl resin, petroleum resin, or the like, the adhesion of the print coat film is improved, and the strength of the ink is increased after being dried. As the organic solvent, alcohol such as ethyl alcohol or isobutyl alcohol, acetone, ketone such as methyl ethyl ketone, ester such as butyl acetate, hydrocarbon such as naphtha, or the like is added. As required, moreover, by adding dispersant, such as fatty acid ester, polyhydric alcohol fatty acid ester, alkyl glyceryl ether or its fatty acid, various lecithin derivatives, propylene glycol fatty acid ester, glycerin fatty acid ester, polyexythylene glycerin fatty acid ester, polyglycerin fatty acid ester, sorbitan fatty acid ester, polyoxyethylene alkyl ether, or the like, the dispersion of the powder is improved, and precipitation by re-aggregation of powder can be prevented.

Next, the mixture is dispersed for 3 hours by using zirconia beads of 0.5 mm in diameter.

Then, passing through a filter of 5 $\mu$m in diameter, an ink is prepared as an electrode ink of organic solvent system at viscosity of 2 poise.

Herein, the particle size of metal powder is defined to be 0.001 $\mu$m or more because it is hard to exist as metal in ordinary state if less than 0.001 $\mu$m. In particular, when nickel, copper, silver, aluminum, zinc or other base metal or their alloy powder was analyzed by using a surface analyzer by ESCA, not only the surface layer but also the inside of the powder was degenerated into oxide or hydroxide of ceramic. It is defined to be 10 $\mu$m or less because if more than 10 $\mu$m, the metal powder is likely to precipitate in the ink. The content of the metal powder is 1 wt. % or more because electric conductivity is not obtained after baking the ink if less than 1 wt. %. It is 80 wt. % or less because the ink is likely to precipitate if more than 85 wt. %. The viscosity is 2 poise or less because if the viscosity is too high, the ink cannot be injected stably from the ink injection port, of if the ink is injected, the ink is too sticky, and the printing precision is impaired.

The ink for electronic component in embodiment 1 is an organic solvent system, but a water-based ink for electronic component may be also prepared. In the case of water-based ink for electronic component, to 100 g of Ni powder with particle size of about 0.5 $\mu$m, 150 g of water or water-based (or water-soluble) organic solvent containing 1 g of additive or resin is added.

Next, the mixture is dispersed for 3 hours by using zirconia beads of 0.5 mm in diameter.

Then, passing through a filter of 5 $\mu$m in diameter, an ink is prepared as a water-based electrode ink at viscosity of 2 poise.

Herein, as the water-based (or water-soluble) organic solvent, ethylene glycol, glycerin, polyethylene glycol, or the like is added. As the resin, by adding a water-soluble resin, such as methyl cellulose, carboxy methyl cellulose, other cellulose resin, polyvinyl alcohol, other vinyl resin, styrene butadiene rubber, other latex resin, or the like, the adhesion of the print coat film is improved, and the strength of the ink after drying is enhanced. As the dispersant, by adding various lecithin derivatives, propylene glycol fatty acid ester, polyexythylene glycerin fatty acid ester, polyglycerin fatty acid ester, sorbitan fatty acid ester, polyoxyethylene sorbit fatty acid ester, polyethylene glycol fatty acid ester, polyoxyethylene alkyl ether, polycarboxylic acid, various soaps, or the like, the dispersion of the powder is improved, and precipitation by re-aggregation of powder can be prevented.

Concerning thus prepared ink for electronic component, a manufacturing method of an electronic component by using this ink for electronic component is explained below while referring to the drawing. In embodiment 1, as an example of electronic component, a laminate ceramic electronic component is explained.

Figure 1:
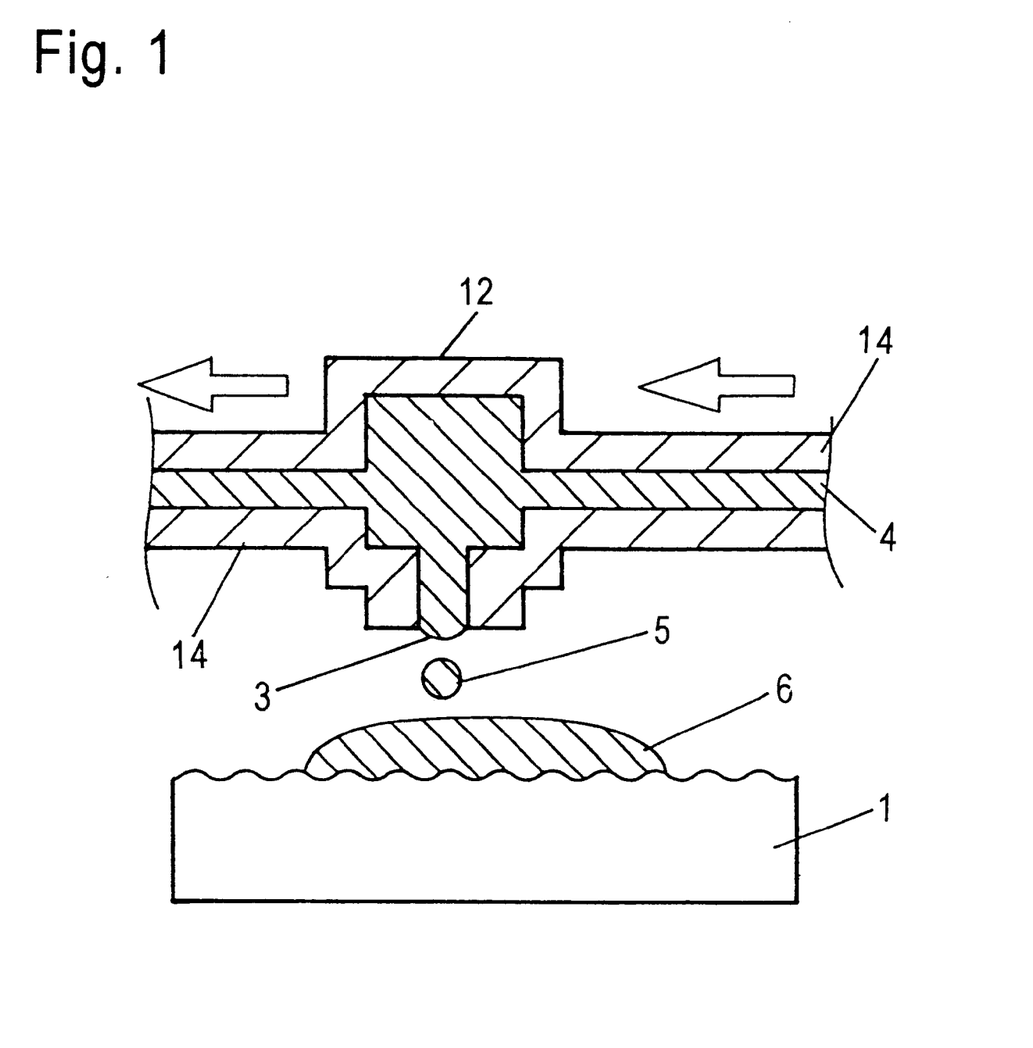
FIG. 1 is a diagram explaining a manufacturing method of a laminate ceramic electronic component in embodiment 1 of the invention.

FIG. 1 is a drawing explaining a manufacturing method of laminate ceramic electronic component in embodiment 1 of the invention.

First, dielectric powder mainly composed of barium titanate with particle size of 0.5 $\mu$m conforming to X7B characteristic of JIS is dispersed together with butyral resin, phthalic acid plasticizer, and organic solvent to obtain a dielectric slurry, and this slurry is passed through a filter of 10 $\mu$m, and is applied on a resin film, and an organic ceramic green sheet 1 of 30 $\mu$m in thickness is prepared.

Next, as shown in FIG. 1, ink droplets 5 of the ink for electronic component 4 (not shown) explained in embodiment 1 for forming the internal electrode are injected on the upper surface of this ceramic green sheet 1 from an ink injection unit 3 of an ink jet device 12 described below of which printing quality is 720 dpi. By the ink droplets 5, an ink pattern 6 is formed on the upper surface of the ceramic green sheet 1.

While peeling off the resin film from the ceramic green sheet 1 having the ink pattern 6 formed in the above step, tens of sheets of the ceramic green sheet 1, including the highest layer and lowest layer if necessary, are pressed and bonded from above and beneath by a press machine, and a raw laminated body of ceramic is formed.

Finally, the raw laminated body of ceramic is cut to a specified size and baked, and an external electrode to be connected electrically to the ink pattern 6 which is the internal electrode is formed, and a laminate ceramic electronic component is manufactured.

The ink jet device used for forming the ink pattern as the internal electrode of thus manufactured laminate ceramic electronic component is described below while referring to the drawing.

Figure 2:
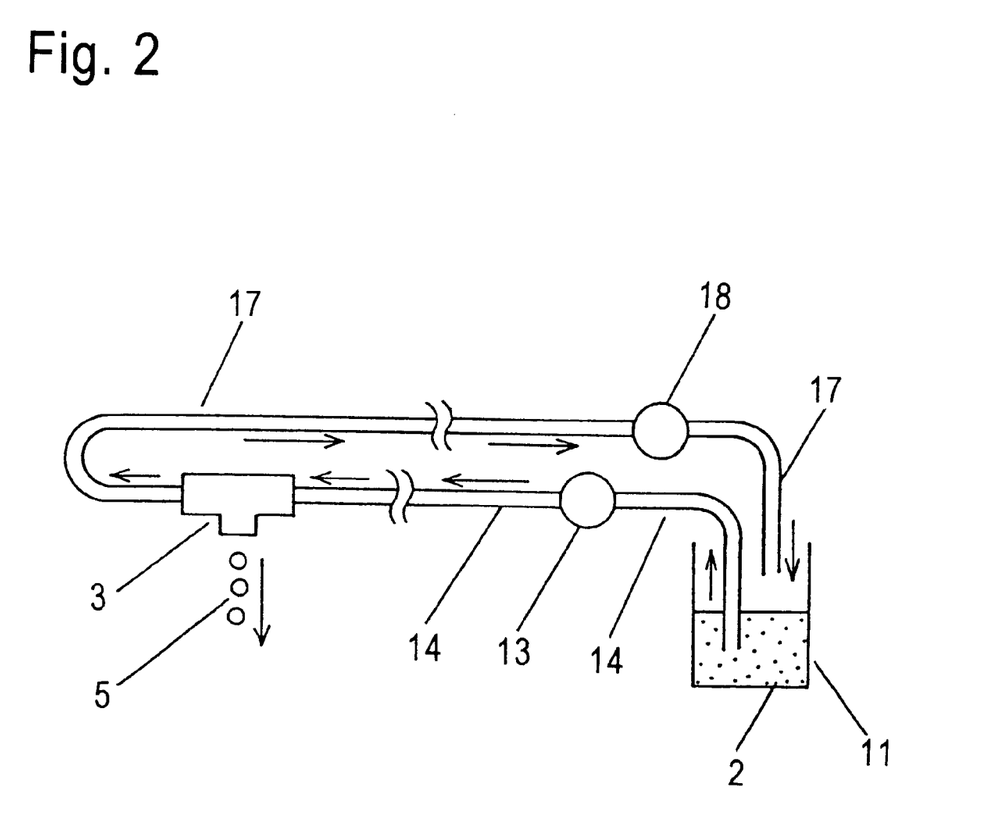
FIG. 2 is a diagram explaining an ink jet device in embodiment 1 of the invention.

FIG. 2 is a drawing explaining the ink jet device in embodiment 1 of the invention.

In the drawing, reference numeral 11 is an ink tank, which is filled with the ink for electronic component 4 of embodiment 1 for forming the internal electrode. This ink tank 11 has a first tube 14 of transparent or translucent resin or the like for sucking the ink 2 through a suction mechanism 13 such as pump at its intermediate position. The side of the first tube 14 opposite to the ink tank 11 side is connected to the ink injection unit 3. The ink injection unit 3 injects a necessary amount of the ink 2 supplied from the first tube 14 outside toward the object of printing in a form of ink droplets 5. The side of the ink injection unit 3 opposite to the first tube 14 side is connected to a second tube 17 of transparent or translucent resin or the like. The second tube 17 sucks the ink 2 not injected by the ink injection unit 3 through an adjustment suction mechanism 18 such as pump, and circulates into the ink tank 11. The adjustment suction mechanism 18 is to stabilize the ink injection amount by adjusting the pressure of the ink 2 at the ink injection unit 3.

Thus composed ink jet device is attached to the portion corresponding to the ink cartridge provided in a commercial ink jet printer, and is used as an ink jet printing machine.

The printing stability of thus composed ink jet device is compared with that of a conventional ink jet device.

Figure 3:
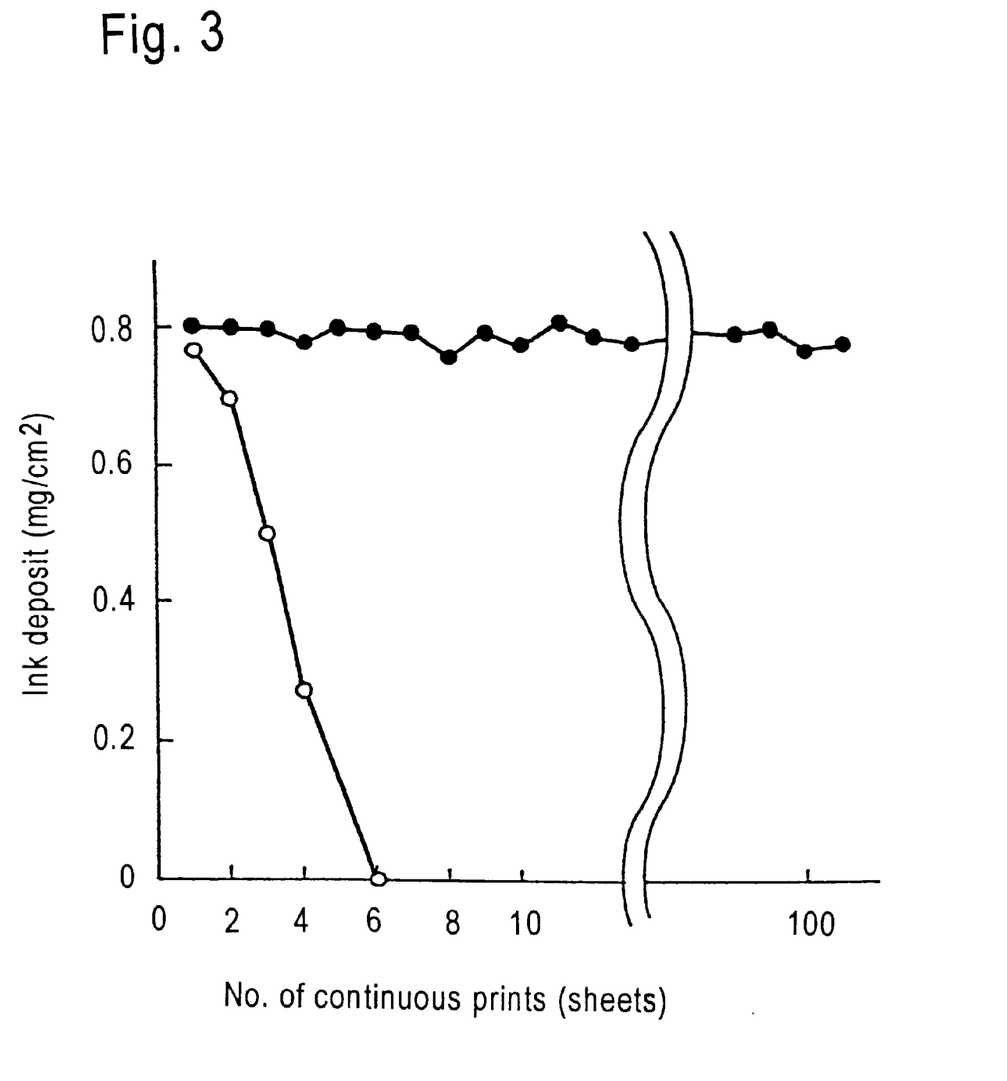
FIG. 3 is a diagram showing the relation between the number of continuous prints and the ink deposit for comparing the printing stability between the ink jet device in embodiment 1 of the invention and a conventional ink jet device.

FIG. 3 is a diagram showing the relation of the number of continuous prints and the ink deposit for comparing the printing stability between the ink jet device in embodiment 1 of the invention and the conventional ink jet device. In the diagram, the white circles refer to the conventional ink jet device for printing without circulating the ink, in which the ink deposit decreased suddenly as the number of prints increased, and the ink injection unit was clogged after 6 prints, no further prints were made. On the other hand, in the ink jet device for circulating the ink of embodiment 1 indicated by dark circles, stable printing is possible after 100 prints.

This is because the ink is passed into the first tube 14, and the powder in the ink 2 undergoes not only the Brownian movement, but also the shearing motion (or shear rate) by the Hagen-Poiseuille law so that the ink running speed is zero in the tube inner wall while the shear rate is maximum in the central part of the tube, and therefore the ink 2 neither precipitates nor re-aggregates.

Moreover, by installing a filter in the first tube 14 between the suction mechanism 13 and the ink injection unit 3 of embodiment 1, and filtering the ink 2 just before printing, aggregates and sediments of the ink 2 formed in the ink tank 11 can be removed completely, and stable printing is realized if the ink is likely to re-aggregate.

When the ink tank 11 is a dispersing machine such as ball mill using Dyno Mill of Shinmaru Enterprises Corporation or similar rotary stand, stable printing is realized for a long time even if the ink is poor in dispersion.

When using an ink of high thixotropy, if the diameter of the first and second tubes 14, 17 is large, a flow region free from shearing force called plug flow occurs in the central part, and the aggregates are likely to collect in this plug flow region, and therefore the diameter of the first and second tubes 14, 17 should be 10 mm or less, and the flow rate should be 0.1 cc/min or more and 10 L/min or less. If the flow rate is less than 0.1 cc/min, the shearing motion in the tube is too small, and powder components in the ink may aggregate or precipitate. If the flow rate exceeds 10 L/min, the ink pressure in the tube is too high, and the ink may spontaneously eject or ooze out from the ink injection unit of the ink jet device, and the printing quality may be lowered.

In embodiment 1, the ink 2 not injected from the ink injection unit 3 is sucked and always circulated into the ink tank 11, but circulation may be stopped while the ink 2 is injected from the ink injection unit 3, that is, during printing. In this case, when the ink injection unit 3 is printing in a single direction, at the time of carriage return, the ink may be circulated when the ink injection unit 3 moves in both directions. The first and second tubes are transparent or translucent, so that the ink state in the tubes can be observed. Flexible tubes are easy to handle.

Since the electrode ink is a water-based ink, shorting can be prevented if the thickness of the ceramic green sheet 1 is less than 15 $\mu$m.

Embodiment 2

An ink for electronic component in embodiment 2 of the invention is described below.

The ink for electronic component in embodiment 2 comprises water or organic solvent, and ceramic powder with particle size of 0.001 $\mu$m or more to 10 $\mu$m or less, dispersed in this water or organic solvent, by 1 wt. % or more to 80 wt. % or less, at viscosity of 2 poise or less.

First, to 100 g of ceramic powder with particle size of 0.001 $\mu$m or more to 10 $\mu$m or less, 200 g of organic solvent or water containing 1 g of additive or resin is added.

Herein, as the ceramic powder, alumina, barium titanate, strontium titanate, the like is added. As the additive, phthalate solvent such as butyl phthalate, or polyethylene oxide, or the like is added. As the resin, by adding cellulose resin, vinyl resin, petroleum resin, or the like, the adhesion of the print coat film is improved, and the strength of the ink is increased after being dried. As the organic solvent, alcohol such as ethyl alcohol or isobutyl alcohol, acetone, ketone such as methyl ethyl ketone, ester such as butyl acetate, hydrocarbon such as naphtha, or the like is added. As required, moreover, by adding dispersant, such as fatty acid ester, polyhydric alcohol fatty acid ester, alkyl glyceryl ether or its fatty acid, various lecithin derivatives, propylene glycol fatty acid ester, glycerin fatty acid ester, polyexythylene glycerin fatty acid ester, polyglycerin fatty acid ester, sorbitan fatty acid ester, polyoxyethylene alkyl ether, or the like, the dispersion of the powder is improved, and precipitation by re-aggregation of powder can be prevented.

Next, the mixture is dispersed for about 3 hours by using zirconia beads of 0.5 mm in diameter.

Then, passing through a filter of 5 $\mu$m in pore size, a ceramic ink of organic solvent system is prepared at viscosity of 0.1 poise.

Herein, the particle size of ceramic powder is defined to be 0.001 $\mu$m or more because the cost is high if less than 0.001 $\mu$m, and it is 10 $\mu$m or less because the ceramic powder is likely to precipitate in the ink if more than 10 $\mu$m. The content of the ceramic powder is 1 wt. % or more because defects by interlayer peeling or pitting are likely to occur after baking the ink if less than 1 wt. %. It is 80 wt. % or less because the ink is likely to precipitate if more than 85 wt. %. The viscosity is 2 poise or less because if the viscosity is too high, the ink cannot be injected stably from the ink injection port, of if the ink is injected, the ink is too sticky, and the printing precision is impaired.

The ceramic ink for electronic component in embodiment 2 is an organic solvent system, but a water-based ceramic ink for electronic component may be also prepared. In the case of water-based ceramic ink for electronic component, to 100 g of ceramic powder with particle size of about 0.5 $\mu$m, 100 g of water or water-based (or water-soluble) organic solvent containing 1 g of additive or resin is added.

Next, the mixture is dispersed for about 3 hours by using zirconia beads of 0.5 mm in diameter.

Then, passing through a filter of 5 $\mu$m in pore size, a water-based electrode ink is prepared at viscosity of 2 poise.

Herein, as the water-based (or water-soluble) organic solvent, ethylene glycol, glycerin, polyethylene glycol, or the like is added. As the resin, by adding a water-soluble resin, such as methyl cellulose, carboxy methyl cellulose, other cellulose resin, polyvinyl alcohol, other vinyl resin, styrene butadiene rubber, other latex resin, or the like, the adhesion of the print coat film is improved, and the strength of the ink after drying is enhanced. As the dispersant, by adding various lecithin derivatives, propylene glycol fatty acid ester, polyexythylene glycerin fatty acid ester, polyglycerin fatty acid ester, sorbitan fatty acid ester, polyoxyethylene sorbit fatty acid ester, polyethylene glycol fatty acid ester, polyoxyethylene alkyl ether, polycarboxylic acid, various soaps, or the like, the dispersion of the powder is improved, and precipitation by re-aggregation of powder can be prevented.

Concerning thus prepared ink for electronic component, a manufacturing method of an electronic component by using this ink for electronic component is explained below while referring to the drawing. In embodiment 2, as an example of electronic component, a laminate ceramic electronic component is explained.

Figure 4:
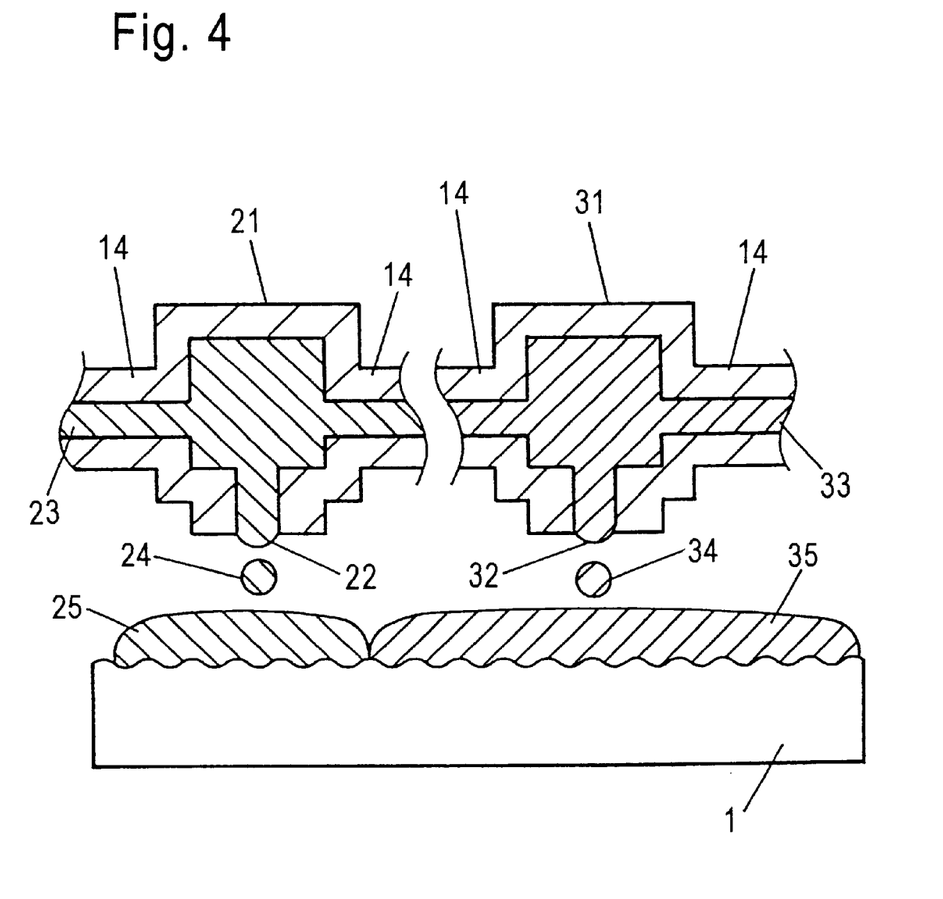
FIG. 4 is a diagram explaining a manufacturing method of a laminate ceramic electronic component in embodiment 2 of the invention.

FIG. 4 is a drawing explaining a manufacturing method of laminate ceramic electronic component in embodiment 2 of the invention.

First, dielectric powder mainly composed of barium titanate with particle size of 0.5 $\mu$m conforming to X7B characteristic of JIS is dispersed together with butyral resin, phthalic acid plasticizer, and organic solvent to obtain a dielectric slurry, and this slurry is passed through a filter of 10 μm in pore size, and is applied on a resin film, and an organic ceramic green sheet 1 of 30 μm In thickness is prepared.

Next, as shown in FIG. 4, first ink droplets 24 of the first ink for electronic component 23 explained in embodiment 1 for forming the internal electrode are injected on the upper surface of this ceramic green sheet 1 from a first ink injection unit 22 of a first ink jet device 21 described below of which printing quality is 720 dpi. By the first ink droplets 24, a first ink pattern 25 is formed on the upper surface of the ceramic green sheet 1 as the internal electrode. This process of forming the first ink pattern 25 is same as explained in embodiment 1.

Simultaneously when forming the first ink pattern 25, second ink droplets 34 of the second ink for electronic component 33 explained in embodiment 2 for forming the ceramic pattern are injected on the upper surface of this ceramic green sheet 1 from a second ink injection unit 32 of a second ink jet device 31 described below of which printing quality is 720 dpi. By the second ink droplets 34, a second ink pattern 35 is formed on the upper surface of the ceramic green sheet 1 as the internal electrode. The second ink jet device 31 used herein has he same constitution as the ink jet device explained in embodiment 1. Herein, by using water-based ink at least in one or both of the first ink for electronic component 23 and second ink for electronic component 33, shorting can be prevented if the thickness of the ceramic green sheet 1 is less than 15 μm.

While peeling off the resin film from the ceramic green sheet 1 having the first and second ink patterns 25, 35 formed in the above step, tens of sheets of the ceramic green sheet 1, including the highest layer and lowest layer if necessary, are pressed and bonded from above and beneath by a press machine, and a raw laminated body of ceramic is formed.

Finally, the raw laminated body of ceramic is cut to a specified size and baked, and an external electrode to be connected electrically to the first ink pattern 25 which is the internal electrode is formed, and a laminate ceramic Electronic component is manufactured.

Embodiment 3

An ink for electronic component in embodiment 3 of the invention is described below.

In the ink for electronic component in embodiment 3, the ink for electronic component for forming the electrode pattern explained in embodiment 1 and embodiment 2 is explained as a first ink, and the ink for electronic component for forming the ceramic pattern is called a second ink. Herein, the first ink and second ink may be of either organic solvent system or water system, which may be selected as required.

A manufacturing method of an electronic component by using the ink for electronic component in embodiment 3 of the invention is explained below while referring to the drawing. In embodiment 3, as an example of electronic component, a laminate ceramic electronic component is explained.

FIG. 5 is a drawing explaining a manufacturing method of laminate ceramic electronic component in embodiment 3 of the invention.

Figure 5A:
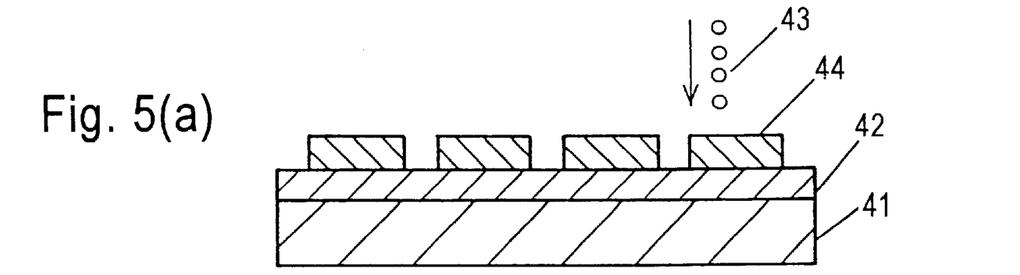
FIG. 5 is a diagram explaining a manufacturing method of a laminate ceramic electronic component in embodiment 3 of the invention.

First, as shown in FIG. 5(a), first ink droplets 43 of the first ink (not shown) are injected toward the upper surface of a ceramic green sheet 42 on the upper surface of a base film 41 from a first ink injection unit (not shown) of a first ink jet device (not shown), and a first ink pattern 44 is formed.

Figure 5B:
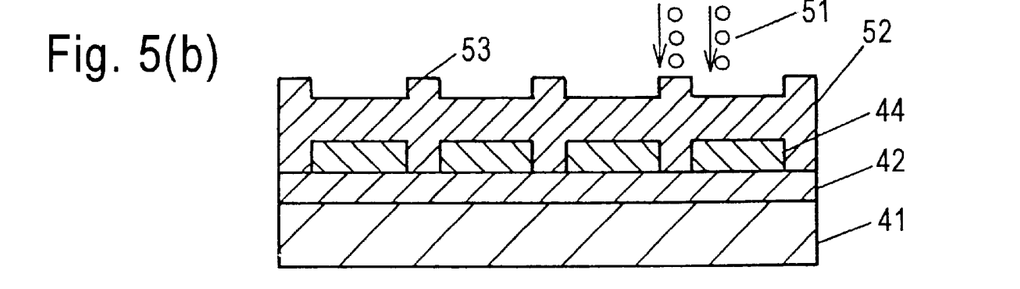

Next, as shown in FIG. 5(b), second ink droplets 51 of the second ink (not shown) are injected toward the upper surface of the ceramic green sheet 42 on the upper surface of the base film 41 for covering at least the first ink pattern 44 from a second ink injection unit (not shown) of a second ink jet device (not shown), and a second ink pattern 52 is formed. At this time, in the ceramic green sheet 42, in the portion corresponding to the upper surface of the first ink pattern 44, the second ink droplets 51 are injected excessively as required, and a second ink pattern protrusion 53 is formed.

Figure 5C:
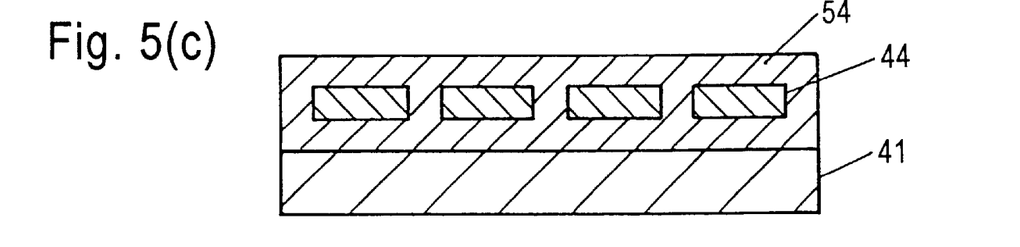

When dried, as shown in FIG. 5(c), the second ink pattern protrusion 53 is buried in the portion corresponding to the upper surface of the first ink pattern 44 on the ceramic green sheet 42, and the upper surface of the second ink pattern 52 becomes smooth, so that a ceramic layer 54 integrated with the ceramic green sheet 42 is formed.

This process is repeated by a plurality of times.

Figure 5D:
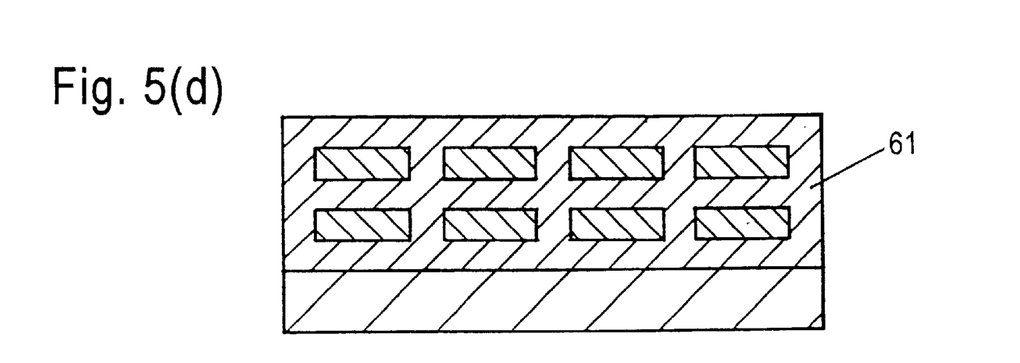

Then, as shown in FIG. 5(d), while peeling off the base film 41 from the integrated ceramic layer 54, it is laminated, pressed and bonded to the upper surface of other integrated ceramic layer 54, and a raw laminated body of ceramic 61 is formed.

Finally, peeling off the base film 41, the raw laminated body of ceramic is cut to a specified size and baked, and an external electrode to be connected electrically to the first ink pattern 44 which is the internal electrode is formed, and a laminate ceramic electronic component is manufactured.

Figure 6:
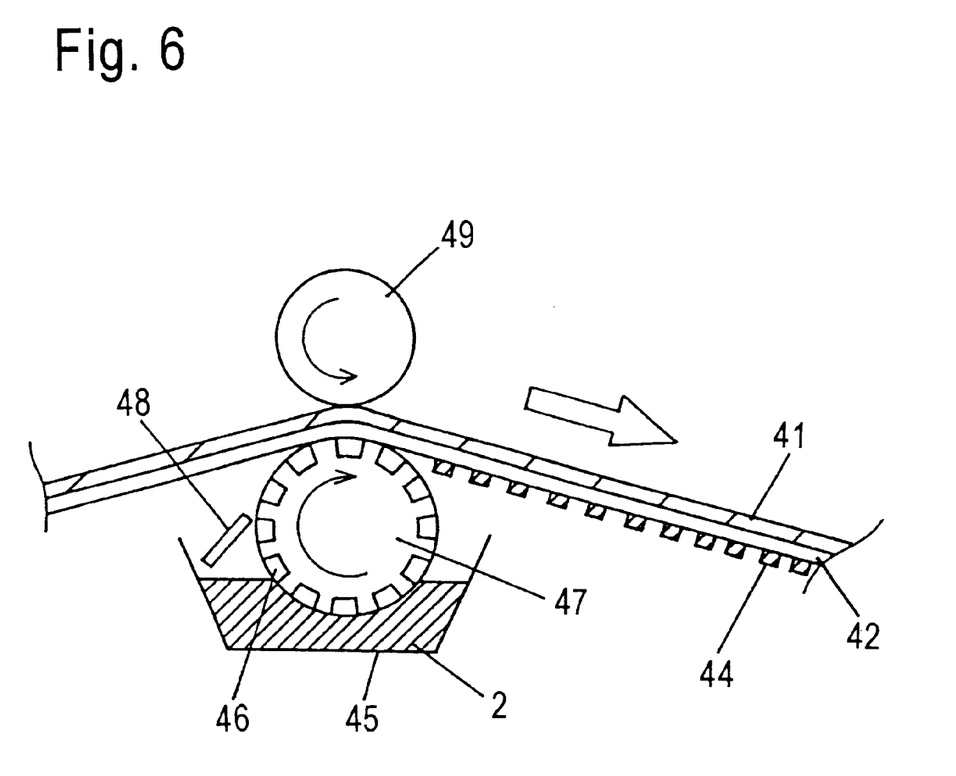
FIG. 6 is a diagram explaining a manufacturing method of a laminate ceramic electronic component in other embodiment.

In this embodiment, the first ink pattern 44 is formed by using the ink jet device, but it may be also formed by gravure printing. In this gravure printing, as shown in FIG. 6, in an ink well 45 containing the ink 2, a gravure plate 47 having ink printing pattern holes 46 is rotated, and a specified amount of ink 2 is adjusted by a doctor blade 48 in the ink printing pattern holes 46. Then the gravure plate 47 is disposed so as to contact with the ceramic green sheet 42 having the base film 41, and it is moved while pressing with a plate cylinder 49, so that the first ink pattern 44 may be formed.

Embodiment 4

An ink for electronic component in embodiment 4 of the invention is described below.

The ink for electronic component in embodiment 4 is the electrode ink, which is the ink for electronic component for forming the electrode pattern explained in embodiment 1 and embodiment 2, and the ink may be of either organic solvent system or water system, which may be selected as required.

A manufacturing method of an electronic component by using the ink for electronic component in embodiment 4 of the invention is explained below while referring to the drawing. In embodiment 4, as an example of electronic component, a coil is explained.

FIG. 7 is a drawing explaining a manufacturing method of coil in embodiment 4 of the invention.

Figure 7A:
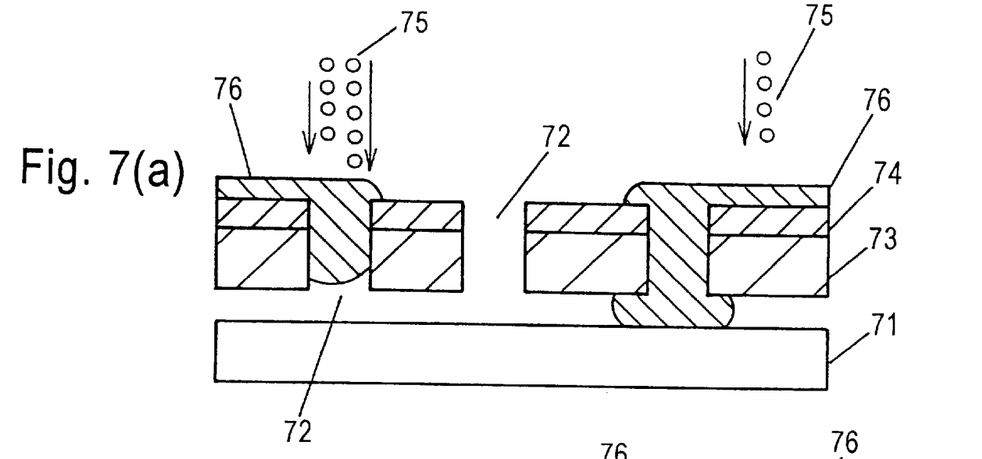
FIG. 7 is a diagram explaining a manufacturing method of a coil in embodiment 4 of the invention.

First, as shown in FIG. 7(a), ink droplets 75 of the electrode ink (not shown) are injected toward the upper surface of a ceramic green sheet 74 having a base film 73 penetrating through via holes 72 fixed on a stage 71 from an ink injection unit (not shown) of an ink jet device (not shown), and an electrode pattern 76 is formed. At this time, the electrode pattern 76 has a desired pattern on the upper surface of the ceramic green sheet 74, and filling up at least the via holes 72.

Figure 7B:
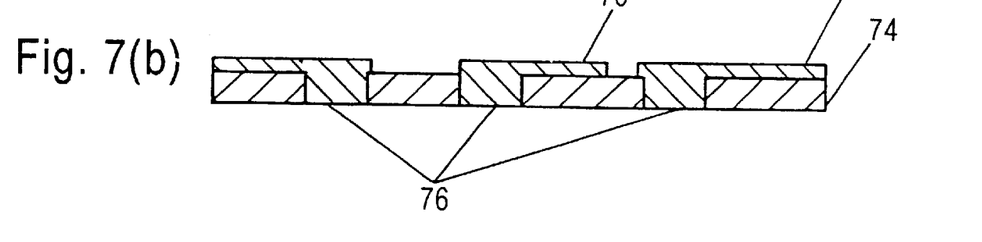

Next, as shown in FIG. 7(b), after plugging the via holes 72 in the ceramic green sheet 74, it is dismounted from the stage 71, and the base film 73 is peeled off.

This process is repeated by a plurality of times, and the ceramic green sheet 74 having the desired electrode pattern 76 is manufactured.

Figure 7C:
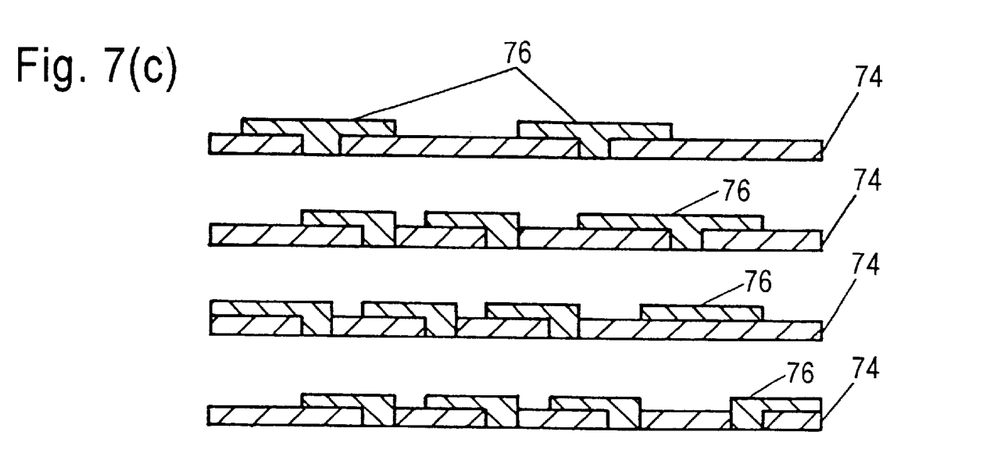

Then, as shown in FIG. 7(c), the specified number of the ceramic green sheets 74 manufactured in the above process are laminated so as to connect the upper and lower electrode patterns 76 electrically, and pressed and integrated, and a raw laminated body of ceramic is formed.

Finally, the raw laminated body of ceramic is cut to a specified size and baked, and an external electrode to be connected electrically to the electrode patterns 76 of the highest and lowest layers is formed, and a coil is manufactured.

Embodiment 5

An ink for electronic component in embodiment 5 of the invention is described below.

The ink for electronic component in embodiment 5 is an resistance ink comprising water or organic solvent, and resistance powder with particle size of 0.001 $\mu$m or more to 10 $\mu$m or less, dispersed in this water or organic solvent, by 1 wt. % or more to 80 wt. % or less, at viscosity of 2 poise or less.

It is also a glass ink comprising water or organic solvent, and glass powder with particle size of 0.001 $\mu$m or more to 10 $\mu$m or less, dispersed in this water or organic solvent, by 1 wt. % or more to 80 wt. % or less, at viscosity of 2 poise or less.

To prepare the ink for electronic component as resistance ink, first, to 100 g of resistance powder with particle size of 0.001 $\mu$m or more to 10 $\mu$m or less, 200 g of organic solvent or water containing 1 g of additive or resin is added.

Herein, as the resistance powder, silver, palladium, silver-palladium, other metal material, ruthenium oxide or other rutile-type oxide, pyrochloroxide as $Pb_2Ru_2O_6$, the like is added, so that the sheet resistance may be 0.1 to 10 M$\Omega$/□. As the additive, phthalate solvent such as butyl phthalate, or polyethylene oxide, or the like is added. As the resin, by adding cellulose resin, vinyl resin, petroleum resin, or the like, the adhesion of the print coat film is improved, and the strength of the ink is increased after being dried. As the organic solvent, alcohol such as ethyl alcohol or isobutyl alcohol, acetone, ketone such as methyl ethyl ketone, ester such as butyl acetate, hydrocarbon such as naphtha, or the like is added. As required, moreover, by adding dispersant, such as fatty acid ester, polyhydric alcohol fatty acid ester, alkyl glyceryl ether or its fatty acid, various lecithin derivatives, propylene glycol fatty acid ester, glycerin fatty acid ester, polyexythylene glycerin fatty acid ester, polyglycerin fatty acid ester, sorbitan fatty acid ester, polyoxyethylene alkyl ether, or the like, the dispersion of the powder is improved, and precipitation by re-aggregation of powder can be prevented.

Next, the mixture is dispersed for 3 hours by using zirconia beads of 0.5 mm in diameter.

Then, passing through a filter of 5 $\mu$m in pore size, an ink is prepared as a resistance ink of organic solvent system at viscosity of 0.05 poise.

This ink for electronic component is of organic solvent system, but it may be prepared as water system as in embodiment 2.

Then, to prepare the resistance ink, first, to 100 g of glass powder with particle size of 0.001 $\mu$m or more to 10 $\mu$m or less, 100 g of organic solvent or water containing 1 g of additive or resin is added.

Herein, as the glass powder, Pb—$SiO_2$—$B_2O_3$ is added. As the additive, bismuth oxide, copper oxide, aluminum oxide, titanium oxide, zinc oxide, magnesium oxide, manganese oxide, or the like is added to enhance the adhesion of alumina substrate and resistance element, and it is also used for adjusting the TCR. As the additive for negative transformation of TCR, titanium, tungsten, molybdenum, niobium, antimony, tantalum, or the like is used. As the additive for positive transformation of TCR, copper, cobalt or the like is used. As the resin, by adding cellulose resin, vinyl resin, petroleum resin, or the like, the adhesion of the print coat film is improved, and the strength of the ink is increased after being dried. As the organic solvent, alcohol such as ethyl alcohol or isobutyl alcohol, acetone, ketone such as methyl ethyl ketone, ester such as butyl acetate, hydrocarbon such as naphtha, or the like is added. As required, moreover, by adding dispersant, such as fatty acid ester, polyhydric alcohol fatty acid ester, alkyl glyceryl ether or its fatty acid, various lecithin derivatives, propylene glycol fatty acid ester, glycerin fatty acid ester, polyexythylene glycerin fatty acid ester, polyglycerin fatty acid ester, sorbitan fatty acid ester, polyoxyethylene alkyl ether, or the like, the dispersion of the powder is improved, and precipitation by re-aggregation of powder can be prevented.

Next, the mixture is dispersed for 3 hours by using zirconia beads of 0.5 mm in diameter.

Then, passing through a filter of 5 $\mu$m in pore size, an ink is prepared as a glass ink of organic solvent system at viscosity of 0.05 poise.

This ink for electronic component is of organic solvent system, but it may be prepared as water system as in embodiment 2.

Concerning thus prepared ink for electronic component, a manufacturing method of an electronic component by using this ink for electronic component is explained below. In embodiment 5, as an example of electronic component, a square chip resistor is explained.

First, near the vertical slot of a sheet substrate having vertical and lateral slots, the ink for forming electrode explained in embodiment 1 or embodiment 2 is applied and an upper electrode layer is formed by an ink jet device.

To straddle over the upper electrode layer, a resistance element is formed by using the resistance ink explained in this embodiment 5 by the ink jet device.

At least to cover this resistance element, a glass protective layer is formed by using the glass ink explained in this embodiment 5.

Dividing the sheet substrate along the lateral slot, a side electrode layer is formed on the split side to connect electrically to the upper electrode.

Finally, dividing into individual pieces, a plating layer is formed to cover the side electrode as required, and a square chip resistor is manufactured.

The ink jet device used herein in the same ink jet device used in embodiment 1, and its explanation is omitted.

In this way, by manufacturing the electronic component by the ink jet method using the resistance ink, since the resistance value can be adjusted preliminarily, trimming is lot necessary, and the resistance patterns individually different in resistance value can be formed easily only by changing the resistance ink, so that multiple types of products in small quantity can be manufactured in a short time. Moreover, by manufacturing an electronic component by the ink jet method using the aforesaid resistance ink and glass ink, it is easy to print in duplicate by controlling the dimensional error of substrate, dimensional balance or thickness dispersion, and hence it is easy to adjust the degree of freedom of pattern change, and thickness and precision of ink coat film.

Embodiment 6

An ink for electronic component in embodiment 6 of the invention is described below.

The ink for electronic component in embodiment 6 is a magnetic ink comprising water or organic solvent, and magnetic powder with particle size of 0.001 μm or more to 10 μm or less, dispersed in this water or organic solvent, by 1 wt. % or more to 80 wt. % or less, at viscosity of 2 poise or less.

To prepare ink for electronic component as magnetic ink, first to 100 g of magnetic powder with particle size of 0.001 μm or more to 10 μm or less, 100 g of organic solvent or water containing 1 g of additive or resin is added.

Herein, as the magnetic powder, nickel-zinc system is added. As the additive, phthalate solvent such as butyl phthalate, or polyethylene oxide, or the like is added. As the resin, by adding cellulose resin, vinyl resin, petroleum resin, or the like, the adhesion of the print coat film is improved, and the strength of the ink is increased after being dried. As the organic solvent, alcohol such as ethyl alcohol or isobutyl alcohol, acetone, ketone such as methyl ethyl ketone, ester such as butyl acetate, hydrocarbon such as naphtha, or the like is added. As required, moreover, by adding dispersant, such as fatty acid ester, polyhydric alcohol fatty acid ester, alkyl glyceryl ether. or its fatty acid, various lecithin derivatives, propylene glycol fatty acid ester, glycerin fatty acid ester, polyexythylene glycerin fatty acid ester, polyglycerin fatty acid ester, sorbitan fatty acid ester, polyoxyethylene alkyl ether, or the like, the dispersion of the powder is improved, and precipitation by re-aggregation of powder can be prevented. Next, the mixture is dispersed for 3 hours by using zirconia beads of 0.5 mm in diameter.

Then, passing through a filter of 5 μm in pore size, an ink is prepared as a magnetic ink of organic solvent system at viscosity of 0.05 poise.

Concerning thus prepared ink for electronic component, a manufacturing method of an electronic component by using this ink for electronic component is explained below. In embodiment 6, as an example of electronic component, an LC filter is explained.

First, on the upper surface of the supporting substrate, the aforesaid magnetic ink and the electrode ink of embodiment 1 or embodiment 2 are alternately injected to a specified pattern by an ink jet device, and the electrode ink is printed inside in a coil form, and this electrode ink is covered by the magnetic ink, thereby forming a three-dimensional structural block.

Finally, this block is cut into a specified shape, baked, and formed into an LC filter.

When manufacturing a high frequency filter or an electronic component for small power of 1 A or less, nickel-zinc magnetic powder is preferably used, and further by adding copper or the like, it is more beneficial because the baking temperature can be lowered and the sintering performance may be enhanced. When manufacturing parts for power source or electronic components for use at large current, it is preferred to use manganese-zinc magnetic powder.

Embodiment 7

An ink for electronic component in embodiment 7 of the invention is described below.

The ink for electronic component in embodiment 7 is a resin ink comprising water or organic solvent, and resin dispersed in this water or organic solvent, by 1 wt. % or more to 80 wt. % or less, at viscosity of 2 poise or less.

To prepare ink for electronic component as resin ink, bisphenol A epoxy resin with average molecular weight of 350 used as resin is diluted in methyl ketone used as organic solvent, at viscosity of 0.05 poise.

Then, passing through a filter of 5 μm in pore size, an ink is prepared as a resin ink.

Using this resin ink instead of the glass protective layer in embodiment 5 in the ink jet device, it can be cured at low temperature, and an electronic component small in resistance fluctuation is manufactured.

Further, by adding ceramic powder with particle size of 1 μm or less as the filler to this resin ink, the coefficient of expansion can be adjusted in relation to the device or electronic component, and the humidity resistance can be enhanced.

Also by adding metal powder, the ink for electronic component becomes conductive, and by injecting by the ink jet device, the circuit board and electronic component can be adhered instead of the solder mounting process.

INDUSTRIAL APPLICABILITY

As described herein, the invention presents an ink for electronic component of high concentration likely to form precipitates or aggregates, and presents a manufacturing method of electronic component enhanced in the quality because the electronic component is printed when necessary for manufacturing, manufactured in a short time, and printed at high precision. At the same time, the product cost is lowered, the yield is enhanced, and an ink jet device enhanced in reliability is presented.

| Reference Numerals |
| --- |
| 1, 42, 74 Ceramic green sheet |
| 2 Ink |
| 3 Ink injection unit |
| 4 Ink for electronic component |
| 5, 75 Ink droplet |
| 6 Ink pattern |
| 11 Ink tank |
| 12 Ink jet device |
| 13 Suction mechanism |
| 14 First tube |
| 17 Second tube |
| 18 Adjustment suction mechanism |
| 21 First ink jet device |
| 22 First ink injection unit |
| 23 First ink for electronic component |
| 24, 43 First ink droplet |
| 24, 44 First ink pattern |
| 31 Second ink jet device |
| 32 Second ink injection unit |
| 33 Second ink for electronic component |
| 34, 51 Second ink droplet |
| 35, 52 Second ink pattern |
| 41, 73 Base film |
| 45 Ink well |
| 46 Ink printing pattern hole |
| 47 Gravure plate |
| 48 Doctor blade |
| 49 Plate cylinder |
| 53 Second ink pattern protrusion |
| 71 Stage |
| 72 Via hole |
| 76 Electrode pattern |

What is claimed is:
1. A manufacturing method of an electronic component comprising the steps of:
(a) repeating a plurality of times a process of forming a specified ink pattern on a ceramic green sheet by an ink jet method by using an ink, wherein the ink includes one of a water solvent and an organic solvent, and a metal powder dispersed in the solvent, the metal powder contained in the ink is in a range of 1 wt. % to 80 wt. %, the metal powder has a particle size in a range of 0.001 μm to 10 μm, a viscosity of the ink is less than 2 poise, the inkjet method including a step of injecting droplets of the ink on a surface of the ceramic green sheet in accordance with the specified ink pattern, and the specified ink pattern is a pattern of an internal electrode, (b) laminating a plurality of the ceramic green sheets forming the specified ink pattern to form a raw laminated body of ceramic, (c) cutting the raw laminated body of ceramic to a specified shape and baking, and (d) forming an external electrode electrically connected to the internal electrode.

2. A manufacturing method of an electronic component comprising the steps of:

(a) repeating a plurality of times a process of forming a first ink pattern on a ceramic green sheet by an ink jet method by using a first ink, wherein the first ink includes one of a water solvent and an organic solvent, and a metal powder dispersed in the solvent, the metal powder contained in the first ink is in a range of 1 wt. % to 80 wt. %, the metal powder has a particle size in a range of 0.001 μm to 10 μm, a viscosity of the first ink is less than 2 poise, the ink jet method including a step of injecting droplets of the first ink on a surface of the ceramic green sheet in accordance with the first ink pattern, and the first ink pattern is a pattern of an internal electrode, and forming a second ink pattern by an ink jet method by using a second ink, wherein the second ink includes one of a water solvent and an organic solvent, and a ceramic powder dispersed in the solvent, the ceramic powder contained in the second ink is in a range of 1 wt. % to 80 wt. %, the ceramic powder has a particle size in a range of 0.001 μm to 10 μm, a viscosity of the second ink is less than 2 poise, the ink jet method including a step of injecting droplets of the second ink on a surface of the ceramic green sheet in accordance with the second ink pattern, (b) laminating a plurality of the ceramic green sheets forming the first ink pattern and the second ink pattern to form a raw laminated body of ceramic, (c) cutting the raw laminated body of ceramic to a specified shape and baking, and (d) forming an external electrode electrically connected to the internal electrode.

3. A manufacturing method of an electronic component comprising the steps of:

(a) repeating a plurality of times a process of forming a first ink pattern on a ceramic green sheet by an ink jet method by using a first ink, wherein the first ink includes one of a water solvent and an organic solvent, and a metal powder dispersed in the solvent, the metal powder contained in the first ink is in a range of 1 wt. % to 80 wt. %, the metal powder has a particle size in a range of 0.001 μm to 10 μm, a viscosity of the first ink is less than 2 poise, the ink jet method including a step of injecting droplets of the first ink on a surface of the ceramic green sheet in accordance with the first ink pattern, and the first ink pattern is a pattern of an internal electrode, forming a second ink pattern by an ink jet method by using a second ink on the upper surface of the ceramic green sheet so as to cover said first ink pattern, and forming a ceramic layer integrated with the ceramic green sheet, wherein the second ink includes at least one solvent of water and organic solvent, and a ceramic powder dispersed in the solvent, the ceramic powder contained in the second ink is in a range of 1 wt. % to 80 wt. %, the ceramic powder has a particle size in a range of 0.001 μm to 10 μm, a viscosity of the second ink is less than 2 poise, the ink jet method including a step of injecting droplets of the second ink on a surface of the ceramic green sheet in accordance with the second ink pattern, (b) laminating a plurality of the ceramic green sheets having the ceramic layer to form a raw laminated body of ceramic, (c) cutting the raw laminated body of ceramic to a specified shape and baking, and (d) forming an external electrode electrically connected to the internal electrode.

4. A manufacturing method of an electronic component comprising the steps of:

(a) forming a pair of upper electrode layers on a confronting upper side of a substrate by a first ink jet method, the first ink jet method including a step of injecting droplets of a first ink, said first ink including an electronic conductive powder, (b) forming a resistance layer so as to straddle over the pair of upper electrode layers by a second ink jet method by using a second ink, wherein the second ink includes one of a water solvent and an organic solvent, and a resistance powder dispersed in the solvent, the resistance powder contained in the second ink is in a range of 1 wt. % to 80 wt. %, the resistance powder has a particle size in a range of 0.001 μm to 10 μm, a viscosity of the second ink is less than 2 poise, the second ink jet method including a step of injecting droplets of the second ink, (c) forming a glass projective layer to cover said resistance layer by a third ink jet method by using a third ink prepared by dispersing glass powder, said third ink jet method including a step of injecting droplets of the third ink.

5. A manufacturing method of electronic component comprising the steps of:

(a) forming a pair of upper electrode layers on a confronting upper side of a substrate by a first ink jet method, the first ink jet method including a step of injecting droplets of a first ink, said first ink including an electronic conductive powder, (b) forming a resistance layer so as to straddle over the pair of upper electrode layers by a second ink jet method by using a second ink, wherein the second ink includes one of a water solvent and an organic solvent, and a resistance powder dispersed in the solvent, the resistance powder contained in the second ink is in a range of 1 wt. % to 80 wt. %, the resistance powder has a particle size in a range of 0.001 µm to 10 µm, a viscosity of the second ink is less than 2 poise, the second ink jet method including a step of injecting droplets of the second ink, (c) forming a projective layer to cover said resistance layer by a third ink jet method by using a third ink prepared by dispersing a resin, said third ink jet method including a step of injecting droplets of the third ink.

6. A manufacturing method of an electronic component comprising the steps of:

injecting a magnetic ink and an electrode ink alternately in a specified pattern by an ink jet method, said magnetic ink prepared by dispersing magnetic powder in at least water or organic solvent, said magnetic powder having a particle size in a range of 0.001 µm to 10 µm, wt. % in a range of 1 to 80, and a viscosity of 2 poise or less, forming a block body of a three-dimensional structure having the electrode ink printed inside in a coil form so as to cover the electrode ink with the magnetic ink, and cutting this block body into a specified form and baking, wherein said ink jet method includes a step of injecting ink droplets of the ink.

7. A manufacturing method of an electronic component comprising the steps of:

forming a plurality of ceramic green sheets having an electrode pattern by repeating a plurality of times a process, said process including the step of injecting an electrode ink by an ink jet method on an upper surface of a ceramic green sheet having a base film with a penetrating via hole while forming an electrode pattern on the upper surface of said ceramic green sheet and in the via hole, and the step of filling at least the via hole with the electrode pattern and peeling off the base film, wherein the electrode ink includes one of a water solvent and an organic solvent, and a metal powder dispersed in the solvent, the metal powder contained in the electrode ink is in a range of 1 wt. % to 80 wt. %, the metal powder has a particle size in a range of 0.001 µm to 10 µm, and a viscosity of the electrode ink is less than 2 poise, said manufacturing method of electronic component further including the steps of:

laminating a desired number of the ceramic green sheets having the electrode pattern so as to connect between upper and lower electrode patterns electrically to form a raw laminated body of ceramic, cutting into a specified shape and baking, and forming an external electrode, wherein said ink jet method includes a step of injecting ink droplets of the ink.

8. A manufacturing method of electronic component comprising the steps of:

(a) preparing an ink by dispersing one powder selected from the group consisting of metal powder, ceramic powder, magnetic powder, glass powder, resistor powder, and resin powder, in a solvent, said ink having a viscosity of 2 poise or less, said powder having a particle size in a range of 0.001 µm to 10 µm, and said powder contained in said ink in a range of 1 wt. % to 80 wt. %, (b) forming an ink pattern by applying said ink on a base material, by an ink jet method, wherein the ink jet method includes a step of injecting droplets of the ink on a surface of the base material, thereby forming said ink pattern, (c) repeating a plurality of times the process of forming said ink pattern.

9. The manufacturing method of electronic component of claim 8, wherein said base material is a ceramic green sheet to be processed by baking, and further comprising the steps of:

(d) forming a raw laminated body by laminating a plurality of said base materials forming an ink pattern, (e) forming a laminated body by cutting said raw laminated body into a specified shape, and baking, and (f) installing an external electrode on said laminated body.

10. The manufacturing method of electronic component of claim 8, wherein said solvent contains at least one of water, water-soluble solvent, and organic solvent.

11. The manufacturing method of electronic component of claim 8, wherein said powder includes the metal powder, and said ink pattern is a pattern of an internal electrode.

12. The manufacturing method of electronic component of claim 8, wherein:

at said step (b), said ink is filled in an ink jet device, said ink jet device comprising:

an ink tank filled with said ink, a first tube for sucking the ink in the ink tank through a suction mechanism, an ink injection unit connected to the first tube for injecting a required amount of the ink, and a second tube connected to the ink injection unit for circulating the ink not injected from the ink injection unit into the ink tank.

13. The manufacturing method of electronic component of claim 12, wherein said ink tank includes a dispersing machine.

14. A manufacturing method of electronic component comprising the steps of:

(a) preparing a first ink which includes a first powder, (b) injecting said first ink on a surface of a first ceramic green sheet while forming a first ink pattern on the surface of said first ceramic green sheet, and (c) baking said first ceramic green sheet including said first ink pattern, and forming a baked body, wherein:

said first ink includes one of a water solvent and an organic solvent, said first powder is dispersed in said solvent, said first powder contained in the ink is in a range of 1 wt. % to 80 wt. %, said first powder has a particle size in a range of 0.001 µm to 10 µm, and a viscosity of said first ink is less than 2 poise.

15. The manufacturing method of electronic component of claim 14, further comprising the steps of:

(d) preparing a second ink which includes a second powder, (e) injecting said second ink on a surface of a second ceramic green sheet, and forming a second ink pattern on the surface of said second ceramic green sheet, and (f) laminating said first green sheet and said second green sheet, and forming a raw laminated body, wherein said (c) step includes a step of baking said raw laminated body, and forming said baked body.

16. The manufacturing method of electronic component of claim 15, wherein said step of injecting said second ink at said step (e) includes a step of injecting droplets of said second ink.

17. The manufacturing method of electronic component of claim 15, wherein:

said first powder and said second powder include a metal powder, said first ink pattern and said second ink pattern form an internal electrode, said step (b) includes a further step of injecting a third ink on said first ceramic green sheet so as to cover said first ink pattern, said third ink including a ceramic powder, said step (e) includes a further step of injecting a fourth ink on said second ceramic green sheet so as to cover said second ink pattern.

18. The manufacturing method of electronic component of claim 14, further comprising the step of:

(g) forming an external electrode on said baked body.

19. The manufacturing method of electronic component of claim 14, wherein said step of injecting said first ink at said step (b) includes a step of injecting droplets of said first ink.

20. The manufacturing method of electronic component of claim 14, wherein said first powder includes a metal powder, and said first ink pattern including said metal powder forms an internal electrode.

21. The manufacturing method of electronic component of claim 14, wherein said first powder includes at least one powder selected from the group consisting of metal powder, ceramic powder, magnetic powder, glass powder, resistor powder, and resin powder.

22. The manufacturing method of electronic component of claim 14, wherein said first powder includes a metal powder, said first ink pattern forms an internal electrode, and said step (b) includes a further step of injecting a third ink on said first ceramic green sheet so as to cover said first ink pattern, said third ink including a ceramic powder.

23. The manufacturing method of electronic component of claim 14, wherein:

at said step (b), said first ink is filled in an ink jet device, said ink jet device comprising:

a first tube for sucking the first ink in the first ink tank through a suction mechanism, an ink injection unit connected to the first tube for injecting a required amount of the ink, and a second tube connected to the ink injection unit for circulating the first ink not injected from the ink injection unit into the first ink tank.

24. The manufacturing method of electronic component of claim 14, wherein said method includes providing a first ink tank, said first ink tank includes a dispersing machine.

25. A manufacturing method of electronic component comprising the steps of:

(a) preparing a first ink which includes a first powder, (b) injecting said first ink on a surface of a first ceramic green sheet while forming a first ink pattern on the surface of said first ceramic green sheet, (c) baking said first ceramic green sheet including said first ink pattern, and forming a baked body, (d) preparing a second ink which includes a second powder, (e) injecting said second ink on a surface of a second ceramic green sheet, and forming a second ink pattern on the surface of said second ceramic green sheet, and (f) laminating said first green sheet and said second green sheet, and forming a raw laminated body, wherein said (c) step includes a step of baking said raw laminated body, and forming said baked body, wherein each ink of said first ink and said second ink includes one of a water solvent and an organic solvent, each powder of said first powder and said second powder is dispersed in said solvent, each powder of said first powder and said second powder contained in the ink is in a range of 1 wt. % to 80 wt. %, said each powder of said first powder and said second powder has a particle size in a range of 0.001 $\mu$m to 10 $\mu$m, and a viscosity of said each of said first ink and said second ink is less than 2 poise.

* * * * *